(12) United States Patent
Yen et al.

(10) Patent No.: US 9,679,782 B1
(45) Date of Patent: Jun. 13, 2017

(54) PLANARIZATION METHOD, METHOD FOR MANUFACTURING SEMICONDUCTOR STRUCTURE, AND SEMICONDUCTOR STRUCTURE

(71) Applicant: TAIWAN SEMICONDUCTOR MANUFACTURING CO., LTD., Hsinchu (TW)

(72) Inventors: Yu-Ting Yen, Kaohsiung (TW); Ying-Ho Chen, Taipei (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 0 days.

(21) Appl. No.: 14/990,526

(22) Filed: Jan. 7, 2016

(51) Int. Cl.
| H01L 21/3115 | (2006.01) |
| H01L 21/3215 | (2006.01) |
| H01L 21/02 | (2006.01) |
| H01L 21/321 | (2006.01) |
| H01L 21/3205 | (2006.01) |
| H01L 21/3105 | (2006.01) |

(52) U.S. Cl.
CPC ...... *H01L 21/3212* (2013.01); *H01L 21/0214* (2013.01); *H01L 21/31053* (2013.01); *H01L 21/31155* (2013.01); *H01L 21/3215* (2013.01); *H01L 21/32055* (2013.01)

(58) Field of Classification Search
CPC .... H01L 21/31051–21/31056; H01L 21/3212; H01L 21/67219; H01L 21/3215; H01L 21/32055; H01L 21/31155; H01L 21/0214

USPC .......................................... 438/690–693, 970
See application file for complete search history.

(56) References Cited

U.S. PATENT DOCUMENTS

| 5,674,784 | A | * | 10/1997 | Jang ...................... H01L 21/316 |
| | | | | 257/E21.244 |
| 6,071,818 | A | * | 6/2000 | Chisholm ............... B24B 37/04 |
| | | | | 257/E21.244 |
| 6,117,779 | A | * | 9/2000 | Shelton .................. B24B 37/04 |
| | | | | 257/E21.244 |
| 6,146,973 | A | * | 11/2000 | He ..................... H01L 21/76237 |
| | | | | 257/E21.551 |
| 6,268,224 | B1 | * | 7/2001 | Miller ............... H01L 21/31053 |
| | | | | 257/E21.244 |
| 6,831,015 | B1 | * | 12/2004 | Inoue .................. H01L 21/3105 |
| | | | | 257/E21.241 |
| 2004/0155341 | A1 | * | 8/2004 | Pipes ................ H01L 21/76237 |
| | | | | 257/751 |
| 2006/0223319 | A1 | * | 10/2006 | Choi .................... H01L 21/3212 |
| | | | | 438/692 |
| 2008/0116926 | A1 | * | 5/2008 | Ko .......................... B82Y 35/00 |
| | | | | 324/755.07 |
| 2011/0204433 | A1 | * | 8/2011 | Fujita ................. H01L 27/11524 |
| | | | | 257/326 |
| 2012/0135589 | A1 | * | 5/2012 | Yang ................. H01L 21/31053 |
| | | | | 438/585 |
| 2012/0315763 | A1 | * | 12/2012 | Hanano ................ B24B 37/044 |
| | | | | 438/693 |

(Continued)

*Primary Examiner* — Hoang-Quan Ho
(74) *Attorney, Agent, or Firm* — Maschoff Brennan

(57) ABSTRACT

A planarization method includes at least two steps. One of the steps is to implant at least one impurity into a wafer to form a polish stop layer in the wafer. The other one of the steps is to polish a top surface of the wafer until reaching the polish stop layer.

20 Claims, 6 Drawing Sheets

(56) References Cited

U.S. PATENT DOCUMENTS

2016/0172208 A1* 6/2016 Carswell ............... H01L 29/16
257/655

* cited by examiner

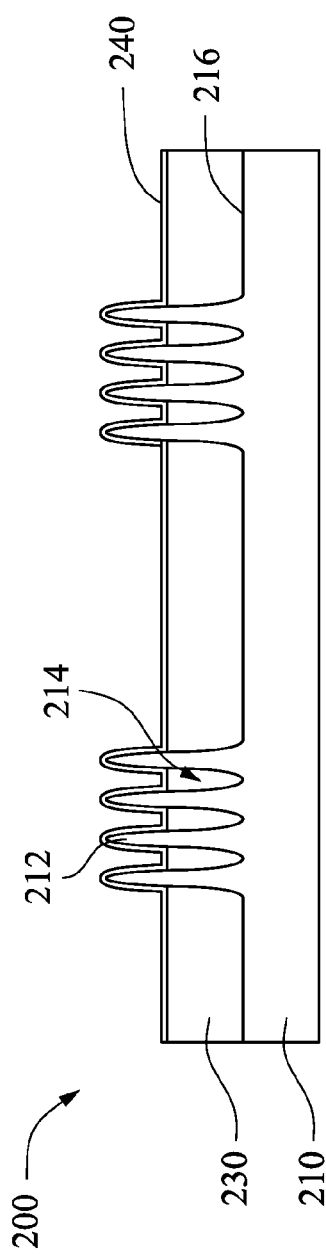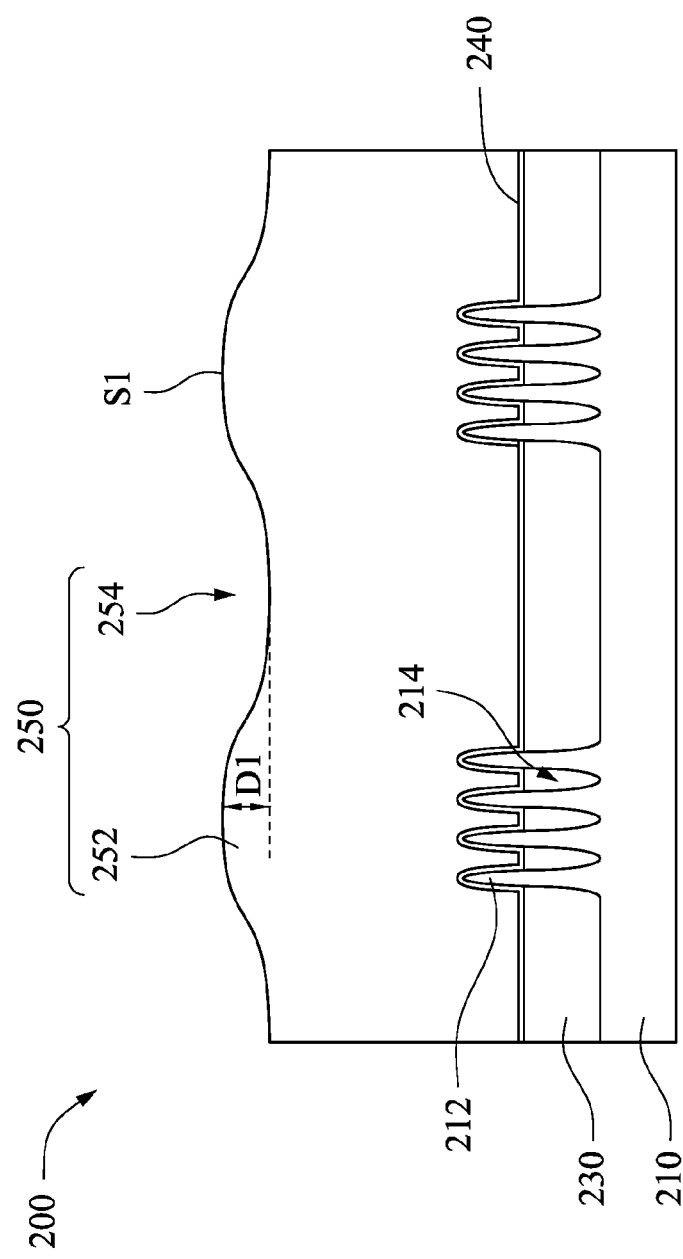

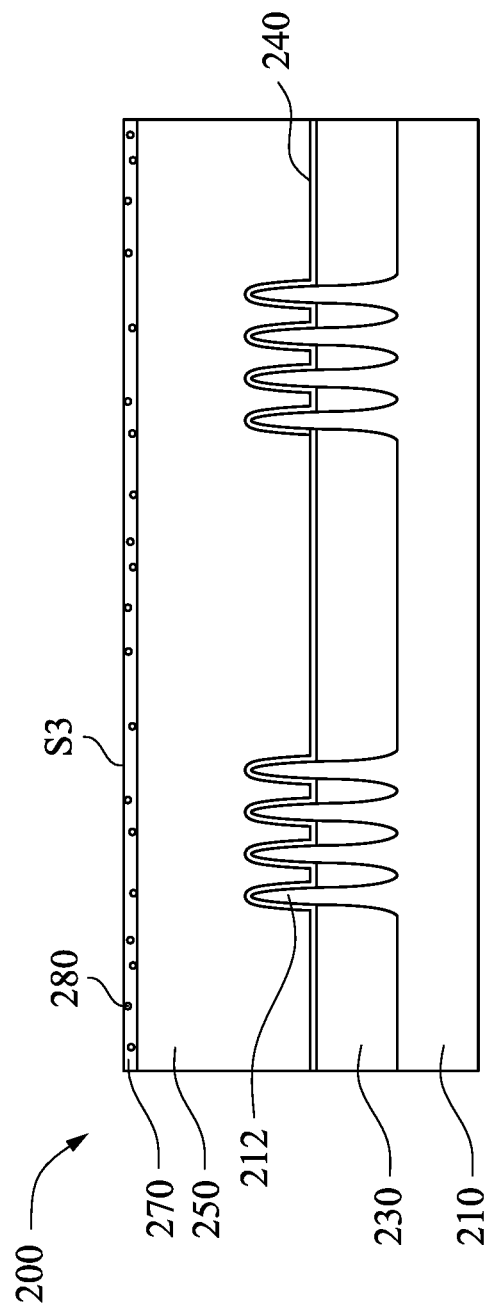

PLANARIZATION METHOD, METHOD FOR MANUFACTURING SEMICONDUCTOR STRUCTURE, AND SEMICONDUCTOR STRUCTURE

BACKGROUND

The present disclosure relates to planarization of semiconductor wafers.

Chemical-mechanical polishing/planarization (CMP) systems place a semiconductor wafer in contact with a polishing pad that moves relative to the semiconductor wafer. The semiconductor wafer may be stationary or it may also rotate on a carrier that holds the wafer. Between the semiconductor wafer and the polishing pad, CMP systems may use slurry. The slurry is a liquid having the ability to lubricate the moving interface between the semiconductor wafer and the polishing pad while mildly abrading and polishing the semiconductor wafer surface with a polishing agent, such as silica or alumina.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 2A-2F are cross-sectional views of intermediate stages in the manufacturing the semiconductor structure in accordance with some embodiments of the present disclosure.

DETAILED DESCRIPTION

Figure 1:
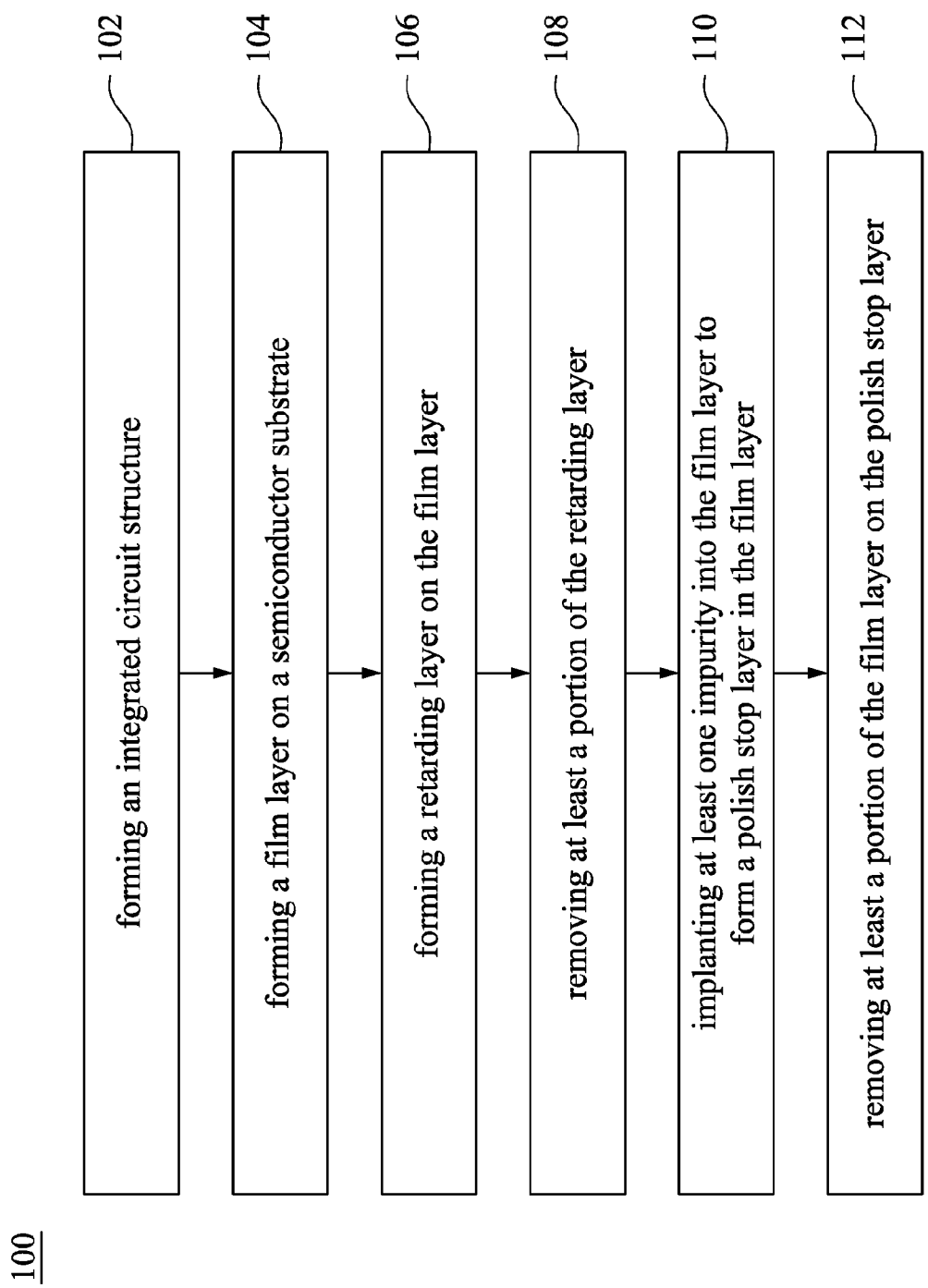
FIG. 1 is a flow chart showing a planarization method for manufacturing a semiconductor structure according to some embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

FIG. 1 is a flow chart showing a planarization method 100 for manufacturing a semiconductor structure according to some embodiments of the present disclosure. It is understood that additional steps may be implemented before, during, and after the method, and some of the steps described may be replaced or eliminated for other embodiments of the method. The semiconductor structure and the method 100 making the same are collectively described with reference to various figures.

Referring to FIG. 1 and FIG. 2A, the method 100 begins at step 102 by forming an integrated circuit structure. The illustrated integrated circuit structure includes a part of a wafer 200, which includes a substrate 210. The substrate 210 is made of a semiconductor material, such as diamond, silicon (Si), germanium (Ge), silicon carbide (SiC), silicon-germanium (SiGe), or combinations thereof. The substrate 210 is, for example, bulk silicon. Other substrates that may be used include silicon on insulator (SOI) substrates, multi-layered substrates, gradient substrates, or hybrid orientation substrates.

In some embodiments of the present disclosure, the semiconductor wafer 200 may include various features used for components of active devices, such as n-channel metal-oxide-semiconductor field-effect transistors (n-channel MOSFETs), p-channel MOSFETs, planar MOSFETs, or fin field-effect transistors (finFETs).

In some embodiments, the substrate 210 may include a plurality of fins 212 with trenches 214 formed therebetween. In some embodiments, chlorine (Cl) or bromine (Br) based reactive-ion etching (RIE) can be used to form the fins 212 and the trenches 214. At least one of the trenches 214 has a depth in a range from about 0.03 micrometers to about 0.2 micrometers.

A dielectric layer 230 may be formed in the trenches 214 to form shallow trench isolation (STI) structures between the fins 212. In some embodiments of the present disclosure, the dielectric layer 230 may be made of a cured flowable dielectric, such as a cured flowable silicon oxide or silicon nitride dielectric material. The dielectric layer 230 may overfill the trenches 214 by using a spin on dielectric (SOD), such as a silicate, a siloxane, a methyl SilsesQuioxane (MSQ), a hydrogen SisesQuioxane (HSQ), an MSQ/HSQ, a perhydrosilazane (TCPS), or a perhydro-polysilazane (PSZ). Alternatively, the dielectric layer 230 may be formed by using a deposition technique, such as plasma enhanced chemical vapor deposition (PECVD). After the dielectric layer 230 overfills the trenches 214, a curing process and an anneal process are performed subsequently on the dielectric layer 230 for densifying the dielectric layer 230 and improving the quality of the dielectric layer 230.

An etch process may then be performed to remove a portion of the dielectric layer 230. Herein, an upper surface of the dielectric layer 230 is configured to be below upper surfaces of the fins 214, such that upper portions of the fins 214 are exposed.

Next, a gate dielectric layer 240 is formed on exposed surfaces of the fins 212 and the top surface of the dielectric layer 230, such that the gate dielectric layer 240 wrap over the upper portions of the fins 212. In some embodiments, the gate dielectric layer 240 may include a high-k dielectric material, such as hafnium oxide ($HfO_2$), lanthanum oxide ($La_2O_3$), aluminum oxide ($Al_2O_3$), or the like. In some embodiments, the gate dielectric layer 240 may include a dielectric material, such as silicon dioxide, silicon nitride, silicon oxynitride. The gate dielectric layer 240 may be formed by using a deposition technique, such as chemical vapor deposition (CVD), plasma enhanced chemical vapor deposition (PECVD), or atomic layer deposition (ALD).

Referring to FIG. 1 and FIG. 2B, the method 100 proceeds to step 104 by forming a film layer 250 on the substrate 210. The film layer 250 covers the features on the substrate 210 with a thickness. In some embodiments, due to the presence of the features (the fins 212 or other devices) on the substrate 210, the film layer 250 disposed thereon has an uneven surface S1. In other words, the film layer 250 may have at least one raised portion 252 above the fins 212, and this results in the formation of at least one recess 254 at the region which is not located above the fins 212. Herein, the recess 254 is described as having a depth D1, which refers to a vertical distance from the highest point of the surface S1 to a lowest point of the surface S1.

In some embodiments of the present disclosure, the film layer 250 may be made of a semiconductor material, such as amorphous silicon or polysilicon, such that a gate stack or a dummy gate stack of the fin field-effect transistors may be formed over the fins 212 of the substrate 210. The film layer 250 is formed by, for example, chemical vapor deposition (CVD), or plasma-enhanced chemical vapor deposition (PECVD).

Alternatively, in some embodiments where other features, such as interconnection structures, are present on the substrate 210, the film layer 250 may be made of a dielectric material, such as silicon oxide, silicon nitride, silicon oxynitride, doped glass (e.g., boron silicate glass), or combinations thereof. The film layer 250 may cover the features on the substrate 210.

Figure 2C:
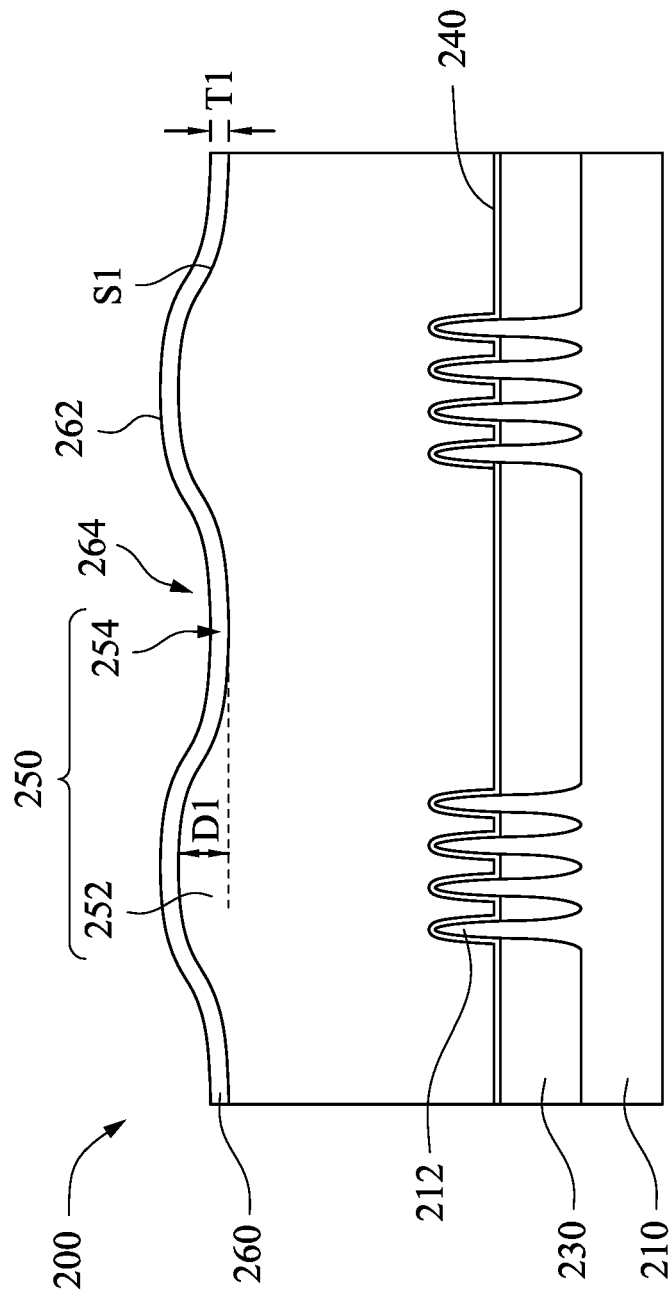

Referring to FIG. 1 and FIG. 2C, the method 100 proceeds to step 106 by forming a retarding layer 260 on the film layer 250. The retarding layer 260 covers the raised portion 252 and the recess 254 of the film layer 250. The retarding layer 260 may be formed with a thickness T1, such that the surface 262 of the retarding layer 260 may have substantially the same surface topography as that of the surface S1. For example, the retarding layer 260 may have a recess 264 on top of the recess 254 of the film layer 250. In some embodiments, the thickness T1 of the retarding layer 260 may be in a range from 3 nanometers to 15 nanometers.

In some embodiments of the present disclosure, when the film layer 250 covers the fins 212 as shown in figure, the film layer 250 may be made of a semiconductor material, and the retarding layer 260 may be made of a dielectric material, such as silicon oxide, silicon nitride, silicon oxynitride, doped glass (e.g., boron silicate glass), or combinations thereof. The retarding layer 260 may be formed by thermal oxidation, chemical vapor deposition (CVD), atomic layer deposition (ALD), or any other appropriate method.

Alternatively, in some embodiments, when the film layer 250 covers other features on the wafer 200, such as interconnect structures, the film layer 250 may be made of a dielectric material, the retarding layer 260 may be made of a semiconductor material, such as amorphous silicon or polysilicon. In some embodiments, the retarding layer 260 is formed by, for example, atomic layer deposition (ALD), chemical vapor deposition (CVD), or plasma-enhanced CVD (PECVD).

Figure 2D:
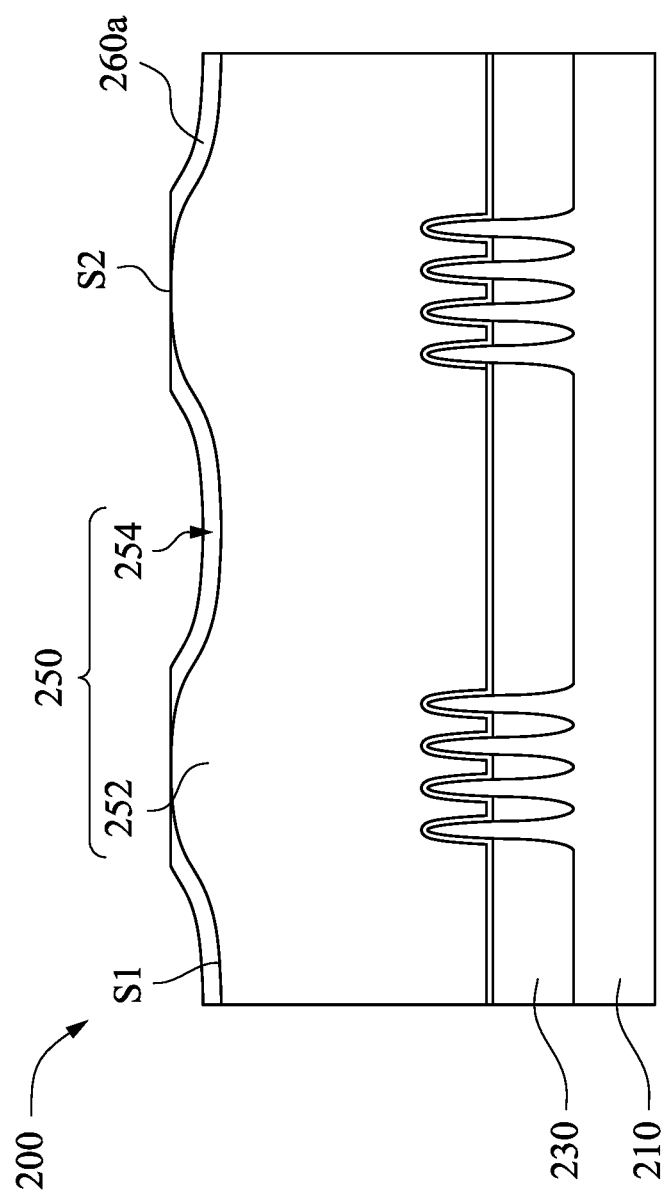

Referring to FIG. 1 and FIG. 2D, the method 100 proceeds to step 108 by removing at least a portion of the retarding layer 260 (see FIG. 2C) on the raised portion 252 of the film layer 250. The removing the portion of the retarding layer 260 leaves a remaining retarding layer 260*a* on the film layer 250. In this way, a surface S2 of the wafer 200 is formed with a more planar topography than that of the surface S1 (see FIG. 2C).

In some embodiments of the present disclosure, the removing the portion of the retarding layer 260 includes a chemical-mechanical polishing (CMP) process, which is also referred to as a chemical-mechanical planarization process.

CMP is a process that utilizes the reagent within slurry to react chemically with the front face of the wafer 200, and produce an easily polished layer. Herein, the front face of the wafer 200 reacting with the slurry is the surface 262 of the retarding layer 260 (see FIG. 2C). Such slurry may contain some active polishing ingredients such as abrasive particles. The abrasive particles are made of aluminum oxide, silicon oxide or cerium oxide, for example. Together with the abrasive action provided by the abrasive particles in the slurry under a polishing pad, the raised portion of the retarding layer 260 (see FIG. 2C) is gradually removed. By repeating the foregoing chemical reaction and mechanical polishing steps, the front surface of the wafer 200 is planarized. A number of variables can affect the CMP process. These include the pressure applied to the polishing head, the planarity of the wafer 200, the rotational speed of the wafer 200 and the polishing pad, the chemical composition of the slurry and the abrasive particles, the operating temperature, the material and abrasive properties of the polishing pad, and so on. After the CMP process, de-ionized water may be used to clear away residue from the CMP process, such as the slurry and abrasive particles on the wafer 200.

Herein, a high-selectivity slurry (HSS) may be used in the polishing process so that the determination of the polishing end point is made clearer. That is, the film layer 250 may have a property relate to the polishing different from that of the retarding layer 260 (see FIG. 2C), such that the film layer 250 may function as a CMP stop layer in the polishing process. In some embodiments, the film layer 250 may have a higher resistance to the polishing than that of the retarding layer 260 (see FIG. 2C). That is to say, in some embodiments, the film layer 250 may be configured to have a greater hardness or a higher resistance to acidic solutions in the slurry than that of the retarding layer 260 (see FIG. 2C). Therefore, the polishing rate of the film layer 250 is relatively slow compared to the rate of the retarding layer 260 (see FIG. 2C). In this way, the CMP process is performed until the raised portion 252 of the film layer 250 is exposed, and the remaining retarding layer 260*a* is present on the recess 254 of the film layer 250.

In some embodiments, however, the materials of the film layer 250 and the retarding layer 260 (see 2C) may be selected without any consideration given to resistance to polishing. Moreover, the CMP process may not exactly stop at the time when the raised portion 252 of the film layer 250 is exposed. Though it is not depicted in the figures, in some embodiments of the present disclosure, the removing the portion of the retarding layer 260 (see 2C) may leave a residue of the retarding layer 260 (see FIG. 2C) on the raised portion 252 of the film layer 250. Alternatively, the removing the portion of the retarding layer 260 (see FIG. 2C) may further remove at least a portion of the film layer 250.

Figure 2E:
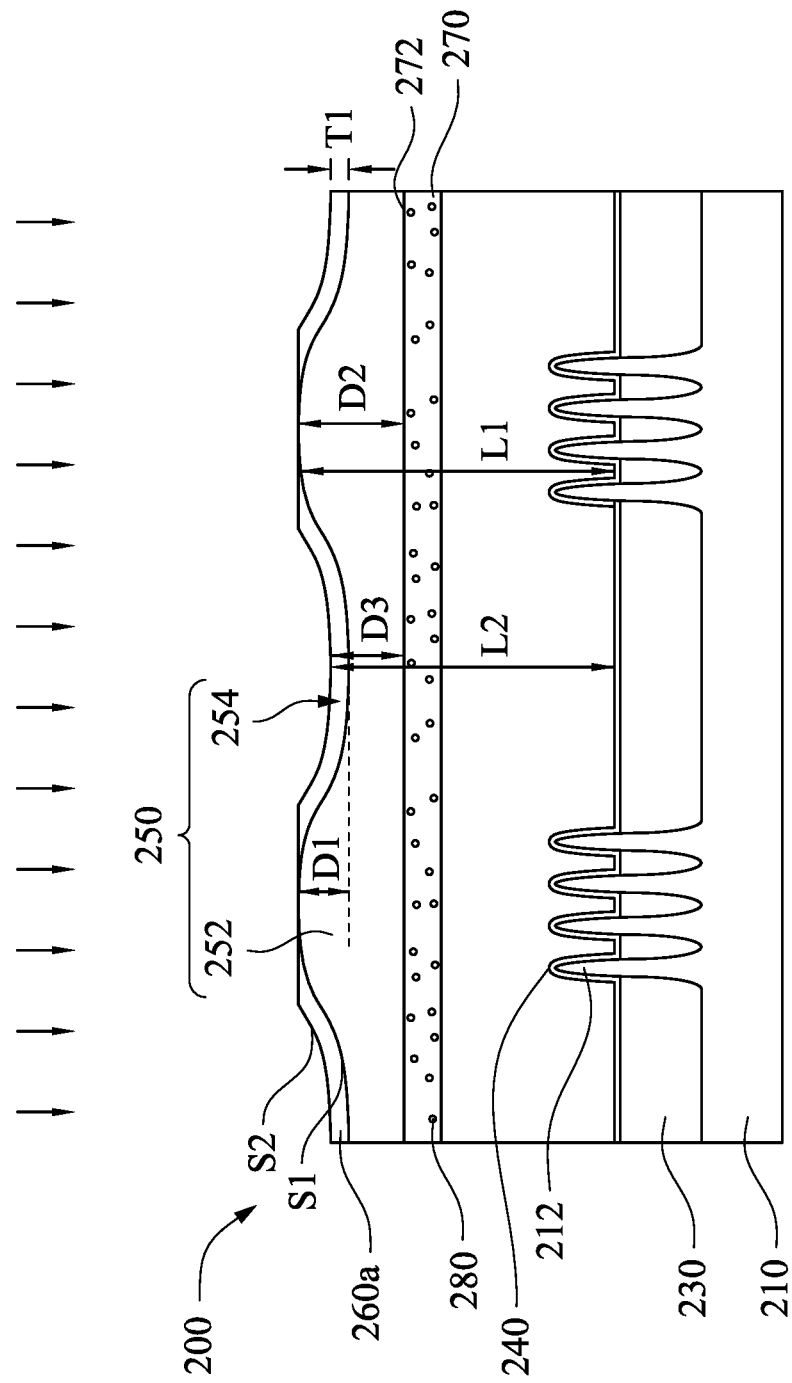

Referring to FIG. 1 and FIG. 2E, the method 100 proceeds to step 110 by performing an implantation process. At least one impurity 280 is implanted into the wafer 200 to form a polish stop layer 270 in the wafer 200. To be specific, the impurity 280 is implanted into the film layer 250 to form the polish stop layer 270 in the film layer 250.

In some embodiments of the present disclosure, the implantation process is a preparing step before polishing the film layer 250, and the polish stop layer 270 acts as an end point for the polishing the film layer 250. The species of the impurity 280 may be selected according to the material of the film layer 250, such that the polish stop layer 270 formed in the film layer 250 may have a property relate to the polishing the film layer 250 different from that of the film layer 250. In some embodiments, the polish stop layer 270 may have a higher resistance to the polishing the film layer 250 than that of the film layer 250. The impurity 280 may be ions, such as boron ions, arsenic ions, or carbon ions, atoms, or molecules, such as nitric oxide or nitride oxides.

For illustrating the embodiments of the present disclosure, the implantation process is briefly introduced herein. The implanted depth of the dopant material is determined, at least in part, by the energy of the ions implanted into the semiconductor wafer. The molecules or ions penetrate into the wafer 200, collide with lattice atoms (nuclei or electrons of the lattice atoms), gradually lose their energy, and stop. The polish stop layer 270 is formed at the depth where the molecules or the ions stop. Herein, an ability to degrade the energy of the beam may be considered as a resistance to the implanting, such as atom density of a region of the wafer 200 where the beam travels. For example, when a region of the wafer 200 has a higher atom density, the energy of the ion beam is degraded more at the region, and the implantation depth becomes lower. Other factors, such as directions of the incident ion path, temperature, etc., may also influence the depth of penetration.

Accordingly, by adjusting the thicknesses and materials (such as atom densities) of the film layer 250 and the remaining retarding layer 260a, the depth of the polish stop layer 270 may be controlled such that the surface 272 may be configured to be substantially planar. With the substantially planar surface 272, the surface of the wafer 200 formed by the subsequent polishing process may also by substantially planar.

Herein, "planar" is used to describe a surface having little difference from a highest level of the surface to a lowest level of the surface. For example, the difference may be in a range from 5 nanometers to 50 nanometers. That is, the difference from a highest level of the surface 272 to a lowest level of the surface 272 may be in a range from 5 nanometers to 50 nanometers.

For example, in some embodiments of the present disclosure, the remaining retarding layer 260a may be configured to have greater resistance to the implanting than that of the film layer 250, such that the implantation depth D2 in the raised portion 252 may be greater than the implantation depth D3 in a combination of the remaining retarding layer 260a and the film layer 250 thereunder. Herein, a thickness of the raised portion 252 is greater than the combination of the remaining retarding layer 260a and the film layer 250 thereunder. For example, the thickness T1 of the remaining retarding layer 260a may be slightly smaller than the depth D1 of the recess 254. The raised portion 252 has a length L1 from a highest point of the surface S1 to the lowest point of the film layer 250, and the combination of the remaining retarding layer 260a and the film layer 250 thereunder has a length L2 from the lowest point of the surface S2 to the lowest point of the film layer 250. A difference between the implantation depth D2 and the length L1 of the raised portion 252 may be adjusted to be substantially equivalent to a difference between the implantation depth D3 and the length L2. As a result, the atoms or ions may substantially arrive a substantially flat region, where the polish stop layer 270 is formed. Therefore, the surface 272 of the polish stop layer 270 is more planar than the surface S2 with the aid of the implantation.

In some embodiments, the thickness T1 of the remaining retarding layer 260a is not necessarily configured to be slightly smaller than the depth D1 of the recess 254, and instead may be comparable to the depth D1 of the recess 254. In fact, the thickness T1 of the retarding layer 260 (see FIG. 2C) may be comparable to or greater than the depth D1 of the recess 254.

In these embodiments, the remaining retarding layer 260a adjusts the implantation depth in different regions of the wafer 200 and makes the surface S2 more planar than the surface S1, and therefore helps the formation of the substantially planar surface 272 of the polish stop layer 270. Moreover, the configuration of the retarding layer 260a reduces the amount of the film layer 250 that is to be removed for forming the surface S2, and thereto saves material costs associated with the film layer 250.

When the film layer 250 made of polysilicon covers the fins 212 and the gate dielectric layer 240, the remaining retarding layer 260a may be made of silicon dioxide, which has a higher atom density than that of the film layer 250 (polysilicon). The impurity 280, such as at least one boron ion, at least one arsenic ion, or at least one carbon ion, is implanted into the film layer 250 (through the remaining retarding layer 260a). In this way, the polish stop layer 270 made of boron-doped polysilicon, arsenic-doped polysilicon, or carbon-doped polysilicon, is formed. The implantation depth in different regions of the wafer 200 may be adjusted by controlling the thickness and distribution of the remaining retarding layer 260a, such that a substantially planar surface 272 of the polish stop layer 270 is formed.

Alternatively, in some embodiments, when the film layer 250 made of dielectric material (such as silicon dioxide) covers the features on the substrate 210, such as interconnect structures, the remaining retarding layer 260a made of amorphous silicon or polysilicon is formed on the film layer 250. The impurity 280, such as nitric oxide (NO) or nitrogen oxide ($N_2O$) is implanted into the film layer 250, and the polish stop layer 270 made of silicon oxynitride may be formed. Similarly, the implantation depth in different regions of the wafer 200 may be adjusted by controlling the thickness and distribution of the remaining retarding layer 260a. By the configuration of the remaining retarding layer 260a, a surface S2 of the wafer 200 which is more planar than the surface S1 may be obtained, thereto a substantially planar surface 272 of the polish stop layer 270 is formed.

In some embodiments, the materials of the remaining retarding layer 260a and the film layer 250 may be selected without any consideration given to the resistance to the implanting process, but any suitable material mentioned above may be used.

Reference is made to FIG. 1, and FIG. 2F. The method 100 proceeds to step 112 by removing at least a portion of the film layer 250 on the polish stop layer 270. The removing process is conducted through a polishing process, which may include a CMP process. FIG. 2F shows the wafer 200 having a substantially planar surface S3 after the removing process.

In some embodiments of the present disclosure, during the CMP process, the wafer 200 is disposed on a rotation holder (not shown) rotated about their respective center axes, and slurry, as described above, is fed onto the wafer 200. A polishing pad of a chemical-mechanical polish tool (CMP tool) may have a physical contact with the surface S2 of the wafer 200 during the CMP process, such that the surface of the wafer 200 is polished. Alternatively, in some embodiments, there is no physical contact between the CMP tool (not shown) and the surface S2 of the wafer 200, and the surface S2 of the wafer 200 is polished by the current force of the slurry.

In some embodiments of the present disclosure, the CMP tool (not shown) may include an endpoint detector (not shown). In some embodiments, the endpoint detector may terminate the polishing process when a rotational torque of the CMP tool increases. In some embodiments, in addition to a torque meter, the endpoint detector may include a current meter, and/or a voltage meter.

As was mentioned in the description related to the CMP process performed on the retarding layer 260 (see FIG. 2C), a high-selectivity slurry (HSS) may be used in the polishing process so that the determination of the polishing end point is made clearer. In the step of removing the film layer 250, the polish stop layer 270 may have a higher resistance to the polishing than that of the film layer 250. That is to say, in some embodiments, the polish stop layer 270 may be configured to have a greater hardness or a higher resistance to the substances in the slurry than that of the film layer 250. Therefore, the polishing rate of the polish stop layer 270 is relatively slow compared to the rate of the film layer 250. In this way, the substantial difference between the resistance (to the polishing) of the polish stop layer 270 and that of the film layer 250 will result in an indication of an end to polishing. It is appreciated that the slurry used in the removing of the retarding layer 260 (see FIG. 2C) and the removing of the film layer 250 above the planarization stop layer 270 may be different and chosen based on the materials of the retarding layer 260 and the film layer 250 respectively.

As a result, a top surface S2 of the wafer 200 is polished until the polish stop layer 270 is reached, such that a surface S3 of the wafer 200 is obtained. In this embodiment, the removing process further removes at least a portion of the polish stop layer 270, but still leaves a thin portion of the polish stop layer 270. Due to the CMP process and the high resistance (to the polishing) of the polish stop layer 270, the surface S3 of the wafer 200 is more planar than the surface 272 of the polish stop layer 270. In this way, the surface of the wafer 200 becomes more planar (from the original surface S1 (see FIG. 2B) to the present surface S3).

In some embodiments of the present disclosure, alternatively instead of leaving a portion of the polish stop layer 270, the removing process may be stopped just at the surface 272 of the polish stop layer 270 and leave the substantially complete polish stop layer 270.

Referring to FIG. 2F, in some embodiments of the present disclosure, a semiconductor structure is obtained from the planarization method 100 (see FIG. 1). The semiconductor structure includes a semiconductor substrate 210, a film layer 250, and a polish stop layer 270. As shown in the figure, the semiconductor structure may include features, such as the fins 212 of the substrate 210 and the gate dielectric layer 240, or other interconnect structures in or on the substrate. The film layer 250 is present on the semiconductor substrate 210 and covering the features or the interconnect structures (not shown). The film layer 250 is made of a film material. The polish stop layer 270 is present on the film layer 250. The polish stop layer 270 is made of the film material doped with at least one impurity 280, such that the polish stop layer 270 and the film layer 250 have different polishing resistance properties. As described above, the polish stop layer 270 may stop the high-selectivity polishing process in the fabrication process of the semiconductor structure, such that the polished surface S3 of the semiconductor structure is planar.

Though, the polish stop layer 270 is depicted to wholly cover the top surface of the film layer 250, it should not limit the scope of the present disclosure. In some embodiments of the present disclosure, the polish stop layer 270 may partially cover the top surface of the film layer 250. That is, the polish stop layer 270 may be fabricated by locally doping or partially doping the into the film layer 250. The polish stop layer 270 may also stop the high-selectivity polishing process.

In embodiments of the present disclosure, through the configuration of the retarding layer, a polish stop layer formed by implanting ions into the film layer has a substantially flat surface. In a polishing process of removing a portion of the fill layer, the polish stop layer may act as a polishing end point such that a semiconductor structure having a substantially planar surface is obtained.

According to some embodiments of the present disclosure, a planarization method includes implanting at least one impurity into a wafer to form a polish stop layer in the wafer, and polishing a top surface of the wafer until reaching the polish stop layer.

According to some embodiments of the present disclosure, a method for manufacturing a semiconductor structure includes forming a film layer on a semiconductor substrate, implanting at least one impurity into the film layer to form a polish stop layer in the film layer, and removing at least a portion of the film layer on the polish stop layer.

According to some embodiments of the present disclosure, a semiconductor structure includes a semiconductor substrate, a film layer, and a polish stop layer. The film layer is present on the semiconductor substrate. The film layer is made of a film material. The polish stop layer is present on the film layer. The polish stop layer is made of the film material doped with at least one impurity, such that the polish stop layer and the film layer have different polishing resistance properties.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should al so realize that such equivalent constructions do not depart from the spirit and scope of the present disclosure, and that they may make various changes, substitutions, and alterations herein without departing from the spirit and scope of the present disclosure.

What is claimed is:

1. A planarization method comprising:
    forming a film layer on a substrate of a wafer, wherein the film layer has at least one raised portion;
    forming a retarding layer on the film layer;
    removing at least a portion of the retarding layer on the raised portion of the film layer;
    implanting at least one impurity into the wafer to form a polish stop layer in the wafer; and
    polishing a top surface of the wafer until reaching the polish stop layer.

2. The planarization method of claim 1, wherein the polish stop layer is formed in the film layer, and the polish stop layer has a higher resistance to the polishing the top surface of the wafer than that of the film layer.

3. The planarization method of claim 1, wherein the polishing the top surface of the wafer comprises a chemical-mechanical polish process.

4. The planarization method of claim 1, wherein the raised portion of the film layer is exposed after the removing the portion of the retarding layer.

5. The planarization method of claim 1, wherein the removing the portion of the retarding layer comprises a chemical-mechanical polish process.

6. The planarization method of claim 5, wherein the film layer has a higher resistance to the chemical-mechanical polish process than that of the retarding layer.

7. The planarization method of claim 1, wherein the retarding layer has a higher resistance to the implanting the impurity into the wafer than that of the film layer.

8. The planarization method of claim 1, wherein the film layer is made of polysilicon, the retarding layer is made of silicon dioxide, and the impurity is a boron ion, an arsenic ion, or a carbon ion.

9. The planarization method of claim 1, wherein the film layer is made of silicon dioxide, the retarding layer is made of polysilicon or amorphous silicon, and the impurity is a nitric oxide or a nitrogen oxide.

10. A method for manufacturing a semiconductor structure, the method comprising:
    forming a film layer on a semiconductor substrate, wherein the film layer has at least one recess;
    forming a retarding layer on the film layer;
    removing at least a portion of the retarding layer, such that a remaining retarding layer is present on the recess of the film layer;
    implanting at least one impurity into the film layer through the remaining retarding layer to form a polish stop layer in the film layer; and
    removing at least a first portion of the film layer on the polish stop layer.

11. The method of claim 10, wherein the removing the first portion of the film layer further removes at least a portion of the polish stop layer.

12. The method of claim 10, wherein the removing the first portion of the film layer is performed by a chemical-mechanical polish tool, and the removing the first portion of the film layer is stopped when a rotational torque of the chemical-mechanical polish tool increases.

13. The method of claim 10, wherein the removing the portion of the retarding layer further removes at least a second portion of the film layer.

14. The method of claim 10, wherein the retarding layer has a higher atom density than that of the film layer.

15. The method of claim 10, wherein the removing the portion of the retarding layer is stopped by the film layer.

16. The planarization method of claim 1, wherein a thickness of the film layer is greater than a thickness of the retarding layer.

17. The planarization method of claim 2, wherein at least a portion of the polish stop layer is left on a remaining film layer after the polishing the top surface of the wafer.

18. The planarization method of claim 1, wherein the polish stop layer is formed to have a top surface more planar than the top surface of the wafer before the polishing the top surface of the wafer.

19. A planarization method comprising:
    forming a film layer on a semiconductor substrate, wherein the film layer has at least one raised portion;
    forming a retarding layer on the film layer;
    removing at least a portion of the retarding layer on the raised portion of the film layer;
    implanting at least one impurity into the film layer to form a polish stop layer in the film layer; and
    removing at least a portion of the film layer on the polish stop layer.

20. The planarization method of claim 19, wherein the forming the retarding layer on the film layer is performed by a deposition.

* * * * *